United States Patent
Noda

(10) Patent No.: US 8,785,923 B2
(45) Date of Patent: Jul. 22, 2014

(54) SEMICONDUCTOR DEVICE

(75) Inventor: Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1 day.

(21) Appl. No.: 13/448,609

(22) Filed: Apr. 17, 2012

(65) Prior Publication Data

US 2012/0273774 A1  Nov. 1, 2012

(30) Foreign Application Priority Data

Apr. 29, 2011  (JP) ................................. 2011-102553

(51) Int. Cl.
*H01L 29/10* (2006.01)

(52) U.S. Cl.
USPC .................. 257/43; 257/330; 257/E21.41

(58) Field of Classification Search
CPC ............ H01L 29/4908; H01L 29/8128; H01L 29/786; H01L 29/7825; H01L 29/4236
USPC ....................... 257/43, 330, E21.41
See application file for complete search history.

(56) References Cited

U.S. PATENT DOCUMENTS

| | | | |
|---|---|---|---|
| 4,835,584 A | 5/1989 | Lancaster | |
| 5,468,979 A | 11/1995 | Tani et al. | |
| 5,528,032 A | 6/1996 | Uchiyama | |
| 5,731,856 A | 3/1998 | Kim et al. | |
| 5,744,864 A | 4/1998 | Cillessen et al. | |
| 5,888,868 A | 3/1999 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Julia Slutsker
(74) *Attorney, Agent, or Firm* — Eric J. Robinson; Robinson Intellectual Property Law Office, P.C.

(57) ABSTRACT

The semiconductor device includes transistors which are stacked. The transistors include a semiconductor substrate having a groove portion and a pair of low-resistance regions between which the groove portion is provided, a first gate insulating film over the semiconductor substrate, a gate electrode overlapping with the groove portion with the first gate insulating film interposed therebetween, a second gate insulating film covering the gate electrode, a pair of electrodes provided over the second gate insulating film so that the groove portion is sandwiched between the pair of electrodes, and a semiconductor film in contact with the pair of electrodes. One of the pair of low-resistance region is electrically connected to one of the pair of electrodes. One of the transistors includes an n-type semiconductor and the other includes a p-type semiconductor, so that a complementary MOS circuit is formed.

12 Claims, 9 Drawing Sheets

(56) References Cited

U.S. PATENT DOCUMENTS

| | | | |
|---|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,592,216 B2 | 9/2009 | Lin et al. |
| 7,592,224 B2 * | 9/2009 | Swift et al. ............. 438/259 |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018240 A1 * | 1/2007 | Chindalore et al. ......... 257/330 |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0187410 A1 | 7/2012 | Yamazaki et al. |
| 2012/0187417 A1 | 7/2012 | Yamazaki et al. |
| 2012/0187475 A1 | 7/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42,4L: Late-News Paper: 4 Inch QVGA Amoled Driven by the Threshold Voltage Controlled Amorphous GIZO (Ga2O3—In2O3—ZnO) TFT,", SID Digest '08: SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters) Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA Amoled Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:the "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for Amoled Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTS,", IDW'09 : Proceedings of the 16th International Display Workshops, 2009, pp. 689-692.
Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZNO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of The SID, 2007, vol. 15 No. 1, pp. 17-22.
Hosono.H, "68.3:Invited Paper:Transparent Amorphous Oxide Semiconductors for High Performance TFT,", SID Digest International Symposium Digest of Technical Papers, 2007, vol. 38, pp. 1830-1833.
Godo.H et al., "P-9:Numerical Analysis on Temperature Dependence of Characteristics of Amorhphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA Amoled Display Using In—Ga—Zn—Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuch.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of The 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.n. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S at al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kim, "Technology for sub-50nm DRAM and NAND Flash Manufacturing," IEDM 05: Technical Digest of International Electron Devices Meeting, Dec. 5, 2005, pp. 333-336.

\* cited by examiner

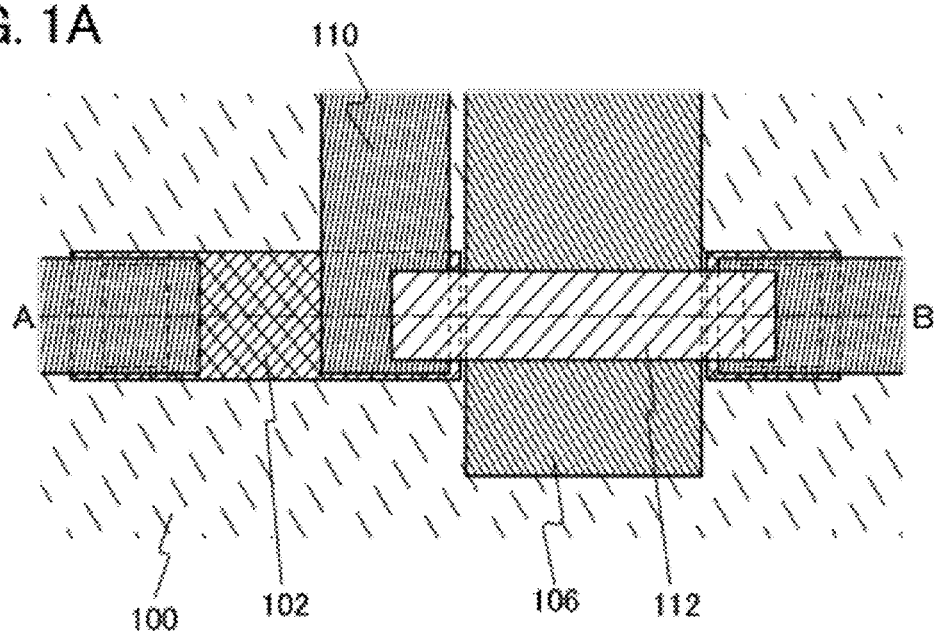
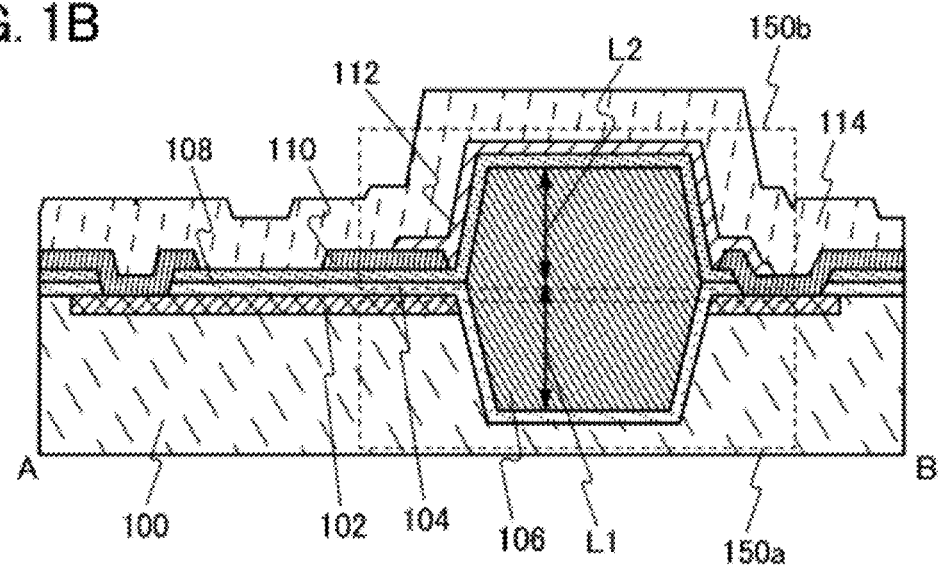

SEMICONDUCTOR DEVICE

BACKGROUND OF THE INVENTION

1. Field of the Invention

The present invention relates to a semiconductor device which is provided with a circuit including a semiconductor element such as a transistor. For example, the present invention relates to an electronic device which includes, as a component, any of a central processing unit (CPU) including a register formed using a transistor, a power device mounted in a power circuit, a semiconductor integrated circuit including a memory, a thyristor, a converter, an image sensor, or the like, an electro-optical device typified by a liquid crystal display device, and a light-emitting display device including a light-emitting element.

In this specification, a "semiconductor device" generally refers to a device which can function by utilizing semiconductor characteristics; an electrooptic device, a display device such as a light-emitting display device, a semiconductor circuit, and an electronic device are all included in semiconductor devices.

2. Description of the Related Art

In recent years, the information society has been increasingly developed, and the demand for higher speed, higher capacity, smaller size, lighter weight, or the like of, for example, a personal computer, a cellular phone, or the like has been increased. Therefore, semiconductor devices such as a large-scale integrated circuit (also referred to as a large scale integration (LSI)) and a central processing unit need higher integration, higher operation speed, and lower power consumption.

Power consumption of the semiconductor device is substantially equal to the total of a power consumption generated in an operation state and a power consumption generated in a stop state (hereinafter referred to as a standby power) of the semiconductor device.

The standby power can be classified into static standby power and dynamic standby power. The static standby power is power consumed by generation of leakage current between a source and a drain, between a gate and the source, and between the gate and the drain in a state where voltage is not applied between the electrodes of a transistor in the semiconductor device, that is, in a state where a potential difference between the gate and the source is approximately 0 V. On the other hand, the dynamic standby power is power which is consumed when voltages of various signals such as a clock signal or a power supply voltage continues to be supplied to a circuit in standby state.

Further, in order to increase the operation speed of the semiconductor device, a microfabrication technique has been developed. As microfabrication of a semiconductor device such as a transistor advances, the channel length of the transistor is shortened and the thicknesses of various insulating layers typified by a gate insulating layer are decreased. Therefore, leakage current of the transistor tends to be increased and accordingly the dynamic standby power is increased.

Further, circuit patterns have been miniaturized in accordance with the scaling law, but there was a time when it was considered difficult to achieve a design rule of 100 nm or less. One of the reasons is that in a transistor having a channel length of 100 nm or less, the leakage current caused by a punch-through phenomenon is likely to flow due to a short-channel effect and the transistor becomes incapable of functioning as a switching element. In order to prevent the punch-through current, a silicon wafer may be doped with an impurity with a high concentration; however, the doping causes a problem in that the junction leakage current easily flows between a source and the substrate or between a drain and the substrate.

Against such a problem, a method has been considered for reducing an area occupied by a transistor on a plane and also maintaining the effective channel length of the transistor by forming a three-dimensional transistor in the semiconductor device so as not to cause a short-channel effect. One example is a structure in which a U-shaped vertically long groove portion (trench) is formed in a region where a channel portion of a transistor is formed, a gate insulating film is formed along a wall surface in the groove portion, and a gate electrode is formed so as to fill the groove portion (see Non-Patent Document 1).

A transistor having a channel portion of such a structure has a long effective channel length because a current flows between a source region and a drain region via an indirect route across the groove portion. Thus, an effect of reducing the area occupied by a transistor and suppressing a short-channel effect can be obtained.

In a general large-scale MOS integrated circuit including digital circuits, a complementary MOS (also called CMOS) circuit is formed with a p-type MOSFET and an n-type MOSFET in order to suppress power consumption.

REFERENCE

Non-Patent Document

[Non-Patent Document 1] Kinam Kim, "Technology for sub-50 nm DRAM and NAND Flash Manufacturing", International Electron Devices Meeting, 2005. IEDM Technical Digest, December 2005, pp. 333-336

SUMMARY OF THE INVENTION

In order to form the CMOS circuit as described above, a p-channel transistor and an n-channel transistor are needed. These two transistors are arranged side by side with each other; thus, an area occupied by the transistors is large.

It is an object of one embodiment of the present invention to provide a semiconductor device which achieves miniaturization and suppression of a short-channel effect and consumes less power. In particular, it is an object is to provide a CMOS circuit.

In the present invention, transistors including a three-dimensional channel region are formed, whereby an effective channel length can be longer than an apparent channel length which corresponds to a distance between a pair of low-resistance regions or a distance between a pair of electrodes viewed from above. Further, the transistors are stacked to overlap with each other; thus, in a region where one transistor is formed when viewed from above, two transistors are provided.

A technical idea of the present invention is to form a complementary MOS circuit by stacking a transistor which includes an n-type semiconductor and a transistor which includes a p-type semiconductor.

One embodiment of the present invention is a semiconductor device including a first transistor and a second transistor which overlap with each other. The first transistor includes a semiconductor substrate in which a groove portion (trench) is provided between a pair of low-resistance regions, a first gate insulating film formed along a shape of the groove portion, and a gate electrode formed in the groove portion with the first gate insulating film interposed therebetween. The second transistor includes the gate electrode formed in the groove portion, a second gate insulating film covering the gate electrode, a semiconductor film overlapping with the gate electrode with the second gate insulating film interposed therebetween, and a pair of electrodes formed to be in contact with the semiconductor film. One of the pair of low-resistance regions is connected to one of the pair of electrodes.

One embodiment of the present invention is a semiconductor device including a semiconductor substrate having a groove portion and a pair of low-resistance regions between which the groove portion is provided, a first gate insulating film over the semiconductor substrate, a gate electrode overlapping with the groove portion with the first gate insulating film interposed therebetween, a second gate insulating film provided to cover the gate electrode, a pair of electrodes provided over the second gate insulating film so that the groove portion is sandwiched between the pair of electrodes, and a semiconductor film in contact with the pair of electrodes. One of the pair of low-resistance regions is connected to one of the pair of electrodes.

In one embodiment of the present invention, the semiconductor substrate is an n-type semiconductor, and the pair of low-resistance regions is a p-type semiconductor.

Further, in the semiconductor device of one embodiment of the present invention, the semiconductor film is formed using an oxide semiconductor containing one or more elements selected from In, Ga, Sn, and Zn. With use of an oxide semiconductor for a channel region of a transistor, the amount of off-state current of the transistor can be small. Thus, when the transistor including an oxide semiconductor is applied to a logic circuit or the like, power consumption can be reduced.

According to one embodiment of the present invention, a semiconductor device which achieves miniaturization and suppression of a short-channel effect and consumes less power can be provided.

BRIEF DESCRIPTION OF THE DRAWINGS

FIGS. 1A and 1B are a top view and a cross-sectional view illustrating an example of a semiconductor device according to an embodiment of the present invention.

DETAILED DESCRIPTION OF THE INVENTION

Figure 2A:
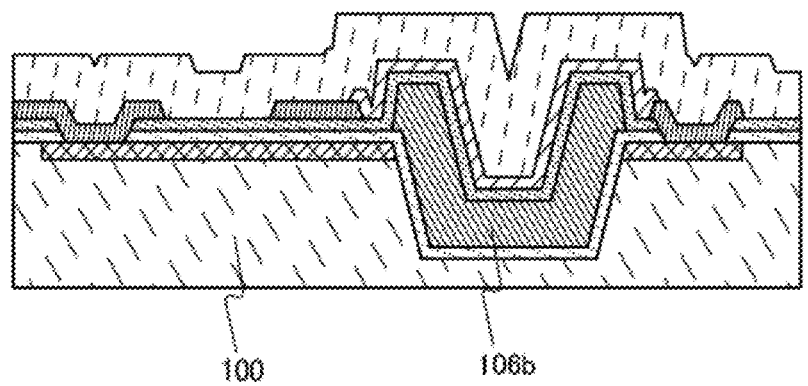
FIGS. 2A and 2B are cross-sectional views each illustrating an example of a semiconductor device according to one embodiment of the present invention.

Embodiments of the present invention will be described below with reference to the accompanying drawings. Note that the present invention is not limited to the following description, and it will be easily understood by those skilled in the art that various changes and modifications can be made without departing from the spirit and scope of the present invention. Therefore, the invention should not be construed as being limited to the description in the following embodiments. Note that the same portions or portions having the same function in the structure of the present invention described below are denoted by the same reference numerals in common among different drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

In addition, in this specification, when one of a source and a drain of a transistor is called a drain, the other is called a source. That is, they are not distinguished depending on the potential level. Therefore, a portion called a source in this specification can be alternatively referred to as a drain.

Embodiment 1

In this embodiment, an example of a transistor which is one embodiment of the present invention will be described with reference to FIGS. 1A and 1B and FIGS. 2A and 2B.

FIG. 1A is a top view of the transistor. FIG. 1B is a cross-sectional view taken along dashed and dotted line A-B of FIG. 1A. In FIG. 1A, some of components of the transistor are omitted to avoid complexity.

The cross section A-B in FIG. 1B will be described in detail below.

The transistor illustrated in FIG. 1B includes a semiconductor substrate 100 having a groove portion, a pair of low-resistance regions 102 provided in the semiconductor substrate 100, a first gate insulating film 104 over the semiconductor substrate 100 and the pair of low-resistance regions 102, a gate electrode 106 provided over the first gate insulating film 104 so as to be sandwiched between the pair of low-resistance regions, a second gate insulating film 108 over the first gate insulating film 104 and the gate electrode 106, a pair of electrodes 110 which is connected to the pair of low-resistance regions 102 through contact holes formed in the first gate insulating film 104 and the second gate insulating film 108, a semiconductor film 112 which is in contact with the pair of electrodes 110 and overlaps with the gate electrode 106 with the second gate insulating film 108 interposed therebetween, and an interlayer insulating film 114 over the semiconductor film 112, the pair of electrodes 110, and the second gate insulating film 108. One of the pair of low-resistance regions 102 is electrically connected to one of the pair of electrodes 110. Further, a contact hole may be formed in the interlayer insulating film 114, and a wiring which is connected to the pair of electrodes 110 through the contact hole may be provided.

In the above structure, a transistor 150a is formed with the semiconductor substrate 100, the pair of low-resistance regions 102, the first gate insulating film 104, and the gate electrode 106, and a transistor 150b is formed with the gate electrode 106, the second gate insulating film 108, the pair of electrodes 110, and the semiconductor film 112.

A single crystal semiconductor substrate or a polycrystalline semiconductor substrate of silicon, silicon carbide, or the like; a compound semiconductor substrate of silicon germanium or the like; an SOI (silicon on insulator) substrate; or the like can be used as the semiconductor substrate 100. Further, the semiconductor substrate 100 is not limited to the above substrate, and the substrate provided with a layer having semiconductor characteristics may be used.

The pair of low-resistance regions 102 is a region functioning as a source region and a drain region of the transistor 150a, which can also be used as a wiring by reducing resistance sufficiently. The pair of low-resistance regions 102 includes an impurity element which makes the semiconductor substrate 100 have n-type or p-type conductivity. As the impurity element imparting n-type or p-type conductivity, for example, phosphorus, boron, or the like can be used.

The first gate insulating film 104 can be formed by a deposition method such as a CVD method or a sputtering method. For example, the first gate insulating film 104 may be a single layer or a stacked layer formed using one or more of a silicon oxide film, a silicon oxynitride film, a silicon nitride oxide film, a silicon nitride film, a gallium oxide film, an aluminum oxide film, and an aluminum oxynitride film. Further, the first gate insulating film 104 may be formed by thermal oxidation or thermal nitridation of the semiconductor substrate 100. Moreover, plasma treatment may be performed in an atmosphere containing oxygen with a high-density plasma apparatus to improve the withstand voltage of the gate insulating film.

When the first gate insulating film 104 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be decreased. Further, a structure in which a high-k material and one or more of silicon oxide, silicon oxynitride, silicon nitride, silicon nitride oxide, aluminum oxide, aluminum oxynitride, and gallium oxide are stacked can be used.

Note that here, silicon oxynitride contains more oxygen than nitrogen and contains, for example, oxygen, nitrogen, silicon, and hydrogen at concentrations higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. Further, silicon nitride oxide contains more nitrogen than oxygen and contains, for example, oxygen, nitrogen, silicon, and hydrogen at concentrations higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). Moreover, the total percentage of the constituent elements does not exceed 100 at. %.

The gate electrode 106 can be formed using polycrystalline silicon including an impurity imparting n-type or p-type conductivity. Further, the gate electrode 106 can be formed using a metal element selected from aluminum, chromium, copper, tantalum, titanium, molybdenum, or tungsten; an alloy containing any of these metal elements as a component; an alloy containing these metal elements in combination; and the like. Further, one or more metal elements selected from manganese or zirconium may be used. Further, the gate electrode 106 may have a single-layer structure or a stacked-layer structure of two or more layers.

The gate electrode 106 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked layer formed using the above light-transmitting conductive material and the above metal element.

The second gate insulating film 108 can be formed by a deposition method such as a CVD method or a sputtering method. For example, the second gate insulating film 108 may be a single layer or a stacked layer formed using one or more of a silicon oxide film, a silicon oxynitride film, a silicon nitride oxide film, a silicon nitride film, a gallium oxide film, an aluminum oxide film, and an aluminum oxynitride film. Furthermore, a high-k material may be used, which is similar to the first gate insulating film 104.

In the case where an oxide semiconductor is used for the semiconductor film 112 of the transistor 150b, a film from which oxygen is released by heating is preferably used for the second gate insulating film 108. "Oxygen is released by heating" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Here, a method in which the amount of released oxygen is measured by being converted into oxygen atoms using TDS analysis will now be described.

The amount of released gas in TDS analysis is proportional to the integral value of a spectrum. Therefore, the amount of released gas can be calculated from the ratio between the integral value of a spectrum of a measurement sample and the reference value of a standard sample. The reference value of a standard sample refers to the ratio of the density of a predetermined atom contained in a sample to the integral value of a spectrum.

For example, the number of oxygen molecules ($N_{O2}$) released from a measurement sample can be found according to Numerical Expression 1 with the TDS analysis results of a silicon wafer containing hydrogen at a predetermined density which is the standard sample and the TDS analysis results of the measurement sample. Here, all spectra at a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = N_{H2}/S_{H2} \times S_{O2} \times \alpha \qquad \text{(Numerical Expression 1)}$$

$N_{H2}$ is the value obtained by conversion of the number of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the measurement sample is subjected to TDS analysis. $\alpha$ is a coefficient affecting the intensity of the spectrum in the TDS analysis. Refer to Japanese Published Patent Application No. H6-275697 for details of the Numerical Expression 1. Note that the amount of released oxygen from the above measurement sample is measured with a thermal desorption spectroscopy apparatus produced by ESCO Ltd., EMD-WA1000S/W using a silicon wafer containing a hydrogen atom at $1\times10^{16}$ atoms/cm$^3$ as the standard sample.

Further, in the TDS analysis, part of released oxygen is detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heating may be an oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

As described above, by using a film from which oxygen is released by heating as the second gate insulating film 108, oxygen is supplied from the second gate insulating film 108 to an oxide semiconductor used for the semiconductor film 112, and thus the interface states of an interface between the second gate insulating film 108 and the semiconductor film 112 can be reduced. As a result, charge or the like, which is generated due to the operation of the transistor 150b or the like, can be prevented from being trapped at the interface between the second gate insulating film 108 and the semiconductor film 112, so that the transistor 150b with little degradation of electric characteristics can be obtained.

Further, electric charge is generated owing to an oxygen vacancy in the oxide semiconductor in some cases. In general, when oxygen vacancies are caused in an oxide semiconductor, part of the oxygen vacancies becomes a donor and causes generation of an electron serving as a carrier. As a result, the threshold voltage of a transistor shifts in the negative direction. However, as described above, oxygen is sufficiently released from the second gate insulating film 108 to the semiconductor film 112, which compensates for oxygen vacancies in the oxide semiconductor used for the semiconductor film 112 in the transistor, which are a cause of the shift of the threshold voltage in the negative direction.

The pair of electrodes 110 is electrodes functioning as a source electrode and a drain electrode of the transistor 150b. The pair of electrodes 110 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used. Note that the pair of electrodes 110 also serves as a wiring.

The semiconductor film 112 may be formed by a sputtering method, a plasma CVD method, a pulsed laser deposition (PLD) method, a molecular beam epitaxy (MBE) method, a coating method, a printing method, an evaporation method, or the like.

As the semiconductor film 112, amorphous silicon, microcrystalline silicon, polycrystalline silicon, silicon germanium, amorphous germanium, polycrystalline germanium, an oxide semiconductor, or the like can be used. With use of an oxide semiconductor, a transistor with a small amount of off-state current can be formed. Thus, the transistor including an oxide semiconductor is applied to a logic circuit or the like, and power consumption can be reduced. Therefore, an oxide semiconductor is preferably used for the semiconductor film 112.

A sputtering apparatus used for forming an oxide semiconductor film as the semiconductor film 112 by a sputtering method will be described in detail below.

The leakage rate of a treatment chamber in which the oxide semiconductor film is formed is preferably lower than or equal to $1\times10^{-10}$ Pa·m$^3$/sec., whereby entry of an impurity into the film to be formed by a sputtering method can be decreased.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1\times10^{-10}$ Pa·m$^3$/sec.

In order to reduce external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and thus the external leakage can be reduced. Further, by use of a metal material covered with iron fluoride, aluminum oxide, chromium oxide, or the like which is in the passive state, a released gas containing hydrogen generated from the metal gasket is suppressed, so that the internal leakage can also be reduced.

As a member for forming an inner wall of the treatment chamber, aluminum, chromium, titanium, zirconium, nickel, or vanadium, from which the amount of a released gas containing hydrogen is small, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the film formation apparatus may be covered with iron fluoride, aluminum oxide, chromium oxide, or the like which is in the passive state.

Furthermore, it is preferable to provide a refiner for a sputtering gas just in front of the treatment chamber. At this time, the length of a pipe between the gas refiner and the treatment chamber is less than or equal to 5 m, preferably less than or equal to 1 m. When the length of the pipe is less than or equal to 5 m or less than or equal to 1 m, the effect of the released gas from the pipe can be reduced accordingly.

Evacuation of the treatment chamber is preferably performed with a rough vacuum pump, such as a dry pump, and a high vacuum pump such as a sputter ion pump, a turbo molecular pump, or a cryopump, in appropriate combination. Whereas the turbo molecular pump has an outstanding capability in evacuating a large-sized molecule, it has a low capability in evacuating hydrogen or water. Further, combination with a cryopump having a high capability in evacuating water or a sputter ion pump having a high capability in evacuating hydrogen is effective.

An adsorbate present at the inner wall of the treatment chamber does not affect the pressure in the treatment chamber because it is adsorbed on the inner wall, but the adsorbate leads to release of a gas at the time of the evacuation of the treatment chamber. Therefore, although the leakage rate and the evacuation rate do not have a correlation, it is preferable that the adsorbate present in the treatment chamber be removed as much as possible and evacuation be performed in advance with use of a pump having high evacuation capability. Note that the treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

In a sputtering method, an RF power supply device, an AC power supply device, a DC power supply device, or the like can be used as a power supply device for generating plasma as appropriate.

The oxide semiconductor film preferably contains one or more elements selected from Ga, Sn, and Zn. Such an oxide semiconductor can be formed using, for example, a target of a four-component metal oxide such as an In—Sn—Ga—Zn-based metal oxide; a three-component metal oxide such as an In—Ga—Zn-based metal oxide, an In—Sn—Zn-based metal oxide, or an In—Al—Zn-based metal oxide; a two-component metal oxide such as an In—Zn-based metal oxide; or the like. In addition, any of the above oxide semiconductors may contain an element other than In, Ga, Sn, and Zn, e.g., $SiO_2$ which is an oxide of Si.

For example, an In—Ga—Zn-based oxide semiconductor means an oxide semiconductor containing indium (In), gallium (Ga), and zinc (Zn).

As a target used for an In—Sn—Zn-based metal oxide, an oxide target with a composition ratio where In:Sn:Zn=1:2:2, 2:1:3, 1:1:1, 20:45:35, or the like [atomic ratio] is used.

As the oxide semiconductor, a thin film represented by the chemical formula, $InMO_3(ZnO)_m$ (m>0) can be used. Here, M represents one or more metal elements selected from Sn, Zn, Ga, Al, Mn, and Co. For example, M can be Ga, Ga and Al, Ga and Mn, Ga and Co, or the like.

In the case where an In—Ga—Zn—O-based material is used as the oxide semiconductor, an example of the target is a metal oxide target containing In, Ga, and Zn at a composition ratio where $In_2O_3:Ga_2O_3:ZnO$=1:1:1 [molar ratio]. Alternatively, a target having a composition ratio where $In_2O_3:Ga_2O_3:ZnO$=1:1:2 [molar ratio], a target having a composition ratio where $In_2O_3:Ga_2O_3:ZnO$=1:1:4 [molar ratio], or a target having a composition ratio where $In_2O_3:Ga_2O_3:ZnO$=2:1:8 [molar ratio] can be used. Alternatively, a target having a composition ratio where $In_2O_3:ZnO$=25:1 to 1:4 [molar ratio] can be used.

In the case where an In—Zn—O-based material is used as an oxide semiconductor, a target therefor has a composition ratio where In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor with an atomic ratio where In:Zn:O=X:Y:Z, the relation of Z>1.5X+Y is satisfied.

As a sputtering gas, a rare gas (typically argon), an oxygen gas, or a mixed gas of a rare gas and an oxygen gas is used as appropriate. It is preferable that a high-purity gas from which impurities such as hydrogen, water, a hydroxyl group, or a hydride is removed be used as a sputtering gas.

As for the oxide semiconductor, a material which has a band gap of 2.5 eV or more, preferably has a band gap of 3.0 eV or more, is selected in order to reduce the off-state current of the transistor.

The concentration of hydrogen contained in the oxide semiconductor is lower than $5\times10^{18}$ $cm^{-3}$, preferably lower than or equal to $1\times10^{18}$ $cm^{-3}$, further preferably lower than or equal to $5\times10^{17}$ $cm^{-3}$, still further preferably lower than or equal to $1\times10^{16}$ $cm^{-3}$.

An alkali metal is not an element included in the oxide semiconductor, and therefore, is an impurity. An alkaline earth metal is also an impurity in the case where an alkaline earth metal is not a constituent for forming the oxide semiconductor. Specifically, when an insulating film in contact with the oxide semiconductor film is an oxide, sodium (Na) among the alkali metals diffuses into the insulating film as a sodium ion ($Na^+$). Further, in the oxide semiconductor film, Na cuts or enters a bond between a metal and oxygen which are included in an oxide semiconductor. As a result, for example, deterioration in characteristics of the transistor such as a normally-on state of the transistor due to a shift of the threshold voltage in the negative direction or a decrease in field-effect mobility occurs; in addition, variation in characteristics is also caused. Therefore, the concentration of an alkali metal which is an impurity in the oxide semiconductor is preferably decreased. Specifically, the measurement value of the Na concentration is preferably lower than or equal to $5\times10^{16}$ $cm^{-3}$, further preferably lower than or equal to $1\times10^{16}$ $cm^{-3}$, still further preferably lower than or equal to $1\times10^{15}$ $cm^{-3}$. In addition, the measurement value of lithium (Li) concentration is preferably lower than or equal to $5\times10^{15}$ $cm^{-3}$, further preferably lower than or equal to $1\times10^{15}$ $cm^{-3}$. In addition, the measurement value of potassium (K) concentration is preferably lower than or equal to $5\times10^{15}$ $cm^{-3}$, further preferably lower than or equal to $1\times10^{15}$ $cm^{-3}$.

By using the oxide semiconductor described above, the off-state current of the transistor can be made small. Specifically, the off-state current of the transistor can be less than or equal to $1\times10^{-18}$ A, less than or equal to $1\times10^{-21}$ A, or less than or equal to $1\times10^{-24}$ A.

The substrate temperature in forming the oxide semiconductor is higher than or equal to 150° C. and lower than or equal to 450° C., preferably higher than or equal to 200° C. and lower than or equal to 350° C. The film formation is performed while the substrate is heated at a temperature higher than or equal to 150° C. and lower than or equal to 450° C., preferably higher than or equal to 200° C. and lower than or equal to 350° C., whereby moisture (including hydrogen) or the like is prevented from entering a film.

Further, as the oxide semiconductor film, a c-axis aligned crystalline oxide semiconductor (CAAC-OS) film may be used.

CAAC-OS is an oxide semiconductor including a crystal with c-axis alignment, which has a triangular or hexagonal atomic arrangement when seen from the direction of an a-b plane, a surface, or an interface and in which metal atoms are arranged in a layered manner, or metal atoms and oxygen atoms are arranged in a layered manner along a c-axis, and the direction of the a-axis or the b-axis is varied in the a-b plane (or the surface or the interface), that is, which rotates around the c-axis.

In a broad sense, CAAC-OS means a non-single-crystal material including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis.

The CAAC-OS is not a single crystal, but does not consist only of amorphous. Although the CAAC-OS includes a crystallized portion (crystalline portion), a boundary between one crystalline portion and another crystalline portion is not clear in some cases.

Nitrogen may be substituted for part of oxygen which is a constituent of the CAAC-OS. The c-axes of individual crystalline portions included in CAAC-OS may be aligned in one direction (e.g., the direction perpendicular to a surface of a substrate over which CAAC-OS is formed, a surface of CAAC-OS, a surface of a CAAC-OS film, an interface of CAAC-OS, or the like). Alternatively, normals of the a-b planes of individual crystalline portions included in CAAC-OS may be aligned in one direction (e.g., the direction perpendicular to a surface of a substrate over which CAAC-OS is formed, a surface of CAAC-OS, a surface of a CAAC-OS film, an interface of CAAC-OS, or the like).

The CAAC-OS is a conductor, a semiconductor, or an insulator, which depends on its composition or the like. The CAAC-OS transmits or does not transmit visible light depending on its composition or the like.

An example of such a CAAC-OS, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

The CAAC-OS will be described in detail with reference to FIGS. 7A to 7E, FIGS. 8A to 8C, and FIGS. 9A to 9C. In FIGS. 7A to 7E, FIGS. 8A to 8C, and FIGS. 9A to 9C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 7A to 7E, O surrounded by a circle represents tetracoordinate O and O surrounded by a double circle represents tricoordinate O.

Figure 7A:
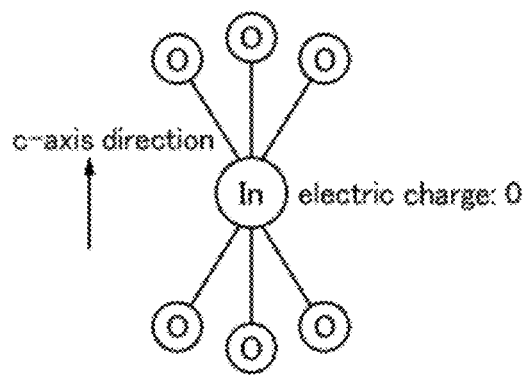
FIGS. 7A to 7E are diagrams illustrating structures of oxide materials according to one embodiment of the present invention.

FIG. 7A illustrates a structure including one hexacoordinate In atom and six tetracoordinate oxygen (hereinafter referred to as tetracoordinate O) atoms proximate to the In atom. Such a structure in which one In atom and proximate oxygen atoms to the In atom are only illustrated is called a subunit here. The structure in FIG. 7A is an octahedral structure, but is illustrated as a planar structure for simplicity. Note that three tetracoordinate O atoms exist in each of an upper half and a lower half in FIG. 7A. In the subunit illustrated in FIG. 7A, the electric charge is O.

Figure 7D:
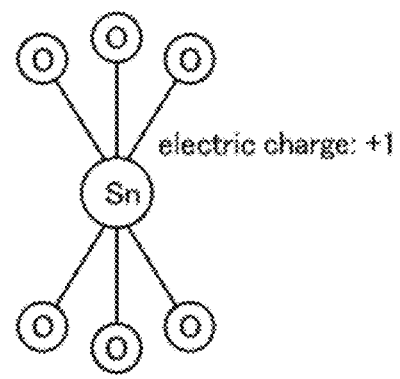
Figure 7B:
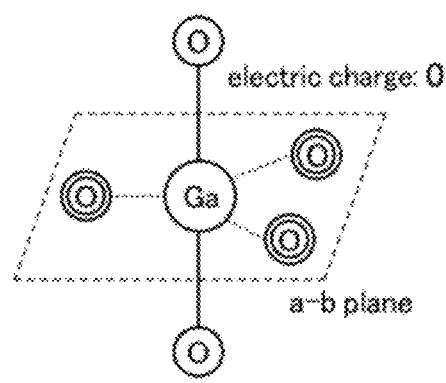

FIG. 7B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 7B. An In atom can also have the structure illustrated in FIG. 7B because an In atom can have five ligands. In the subunit illustrated in FIG. 7B, the electric charge is O.

Figure 7E:
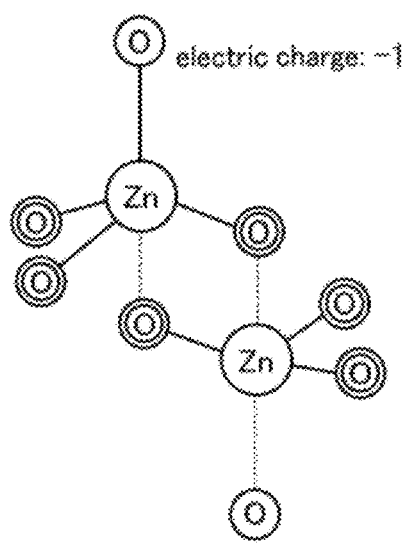
Figure 7C:
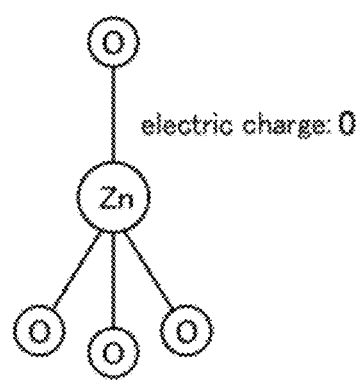

FIG. 7C illustrates a structure including one tetracoordinate Zn atom and four tetracoordinate O atoms proximate to the Zn atom. In FIG. 7C, one tetracoordinate O atom exists in an upper half and three tetracoordinate O atoms exist in a lower half Alternatively, three tetracoordinate O atoms may exist in the upper half and one tetracoordinate O atom may exist in the lower half in FIG. 7C. In the subunit illustrated in FIG. 7C, the electric charge is O.

FIG. 7D illustrates a structure including one hexacoordinate Sn atom and six tetracoordinate O atoms proximate to the Sn atom. In FIG. 7D, three tetracoordinate O atoms exist in each of an upper half and a lower half In the subunit illustrated in FIG. 7D, the electric charge is +1.

FIG. 7E illustrates a subunit including two Zn atoms. In FIG. 7E, one tetracoordinate O atom exists in each of an upper half and a lower half In the subunit illustrated in FIG. 7E, the electric charge is −1.

Here, a plurality of subunits forms one group, and one cycle including a plurality of groups is called one unit.

Now, a rule of bonding between the subunits will be described.

The three O atoms in the upper half with respect to the hexacoordinate In atom in FIG. 7A each have three proximate In atoms in the downward direction, and the three O atoms in the lower half each have three proximate In atoms in the upward direction. The one O atom in the upper half with respect to the pentacoordinate Ga atom in FIG. 7B has one proximate Ga atom in the downward direction, and the one O atom in the lower half has one proximate Ga atom in the upward direction. The one O atom in the upper half with respect to the tetracoordinate Zn atom in FIG. 7C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. Besides, subunits are bonded to each other so that the total electric charge in the layered structure is O, whereby one group is formed.

Figure 8A:
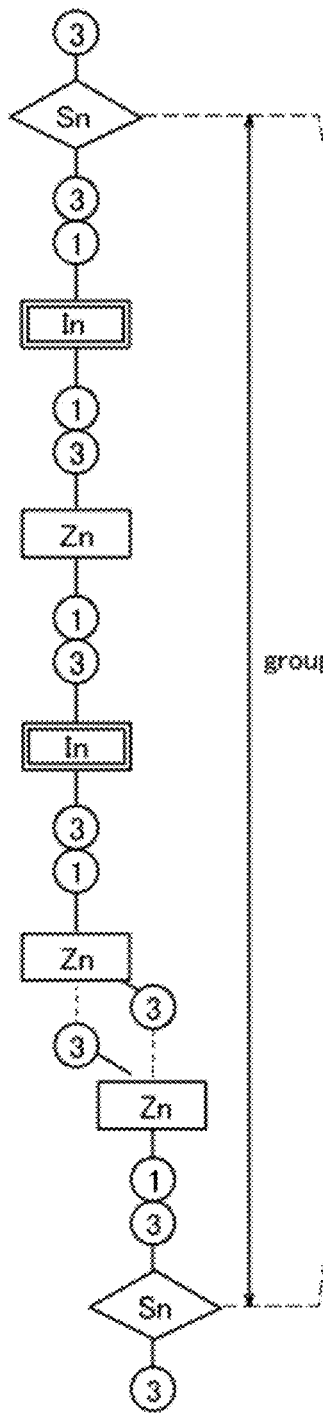
FIGS. 8A to 8C illustrate a structure of an oxide material according to one embodiment of the present invention.
Figure 8B:
Figure 8C:
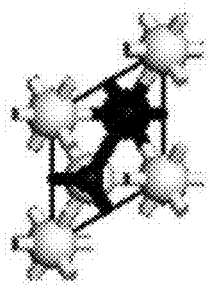

FIG. 8A illustrates a model of one group included in a layered structure of an In—Sn—Zn—O-based material. FIG. 8B illustrates a unit including three groups. Note that FIG. 8C illustrates an atomic arrangement in the case where the layered structure in FIG. 8B is observed from the c-axis direction.

In FIG. 8A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 8A, one tetracoordinate O atom existing in each of an upper half and a lower half with respect to an In atom is denoted by circled 1. FIG. 8A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn—O-based material in FIG. 8A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A unit is formed by bonding a plurality of groups, which corresponds to one cycle.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Thus, electric charge of a subunit including Sn is +1. Therefore, electric charge of −1, which cancels +1, is needed to form a layered structure including a Sn atom. As a structure having electric charge of −1, the subunit including two Zn atoms as illustrated in FIG. 7E can be given. For example, with one subunit including two Zn atoms, electric charge of one subunit including Sn is canceled, so that the total electric charge in the layered structure can be 0.

An In atom can have either five ligands or six ligands. Specifically, when a unit illustrated in FIG. 8B is formed, In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_2(ZnO)_m$ (m is 0 or a natural number).

The above-described rule also applies to the following materials: a four-component metal oxide such as an In—Sn—Ga—Zn-based oxide material; a three-component metal oxide such as an In—Ga—Zn-based oxide material (also referred to as IGZO), an In—Al—Zn-based oxide material, a Sn—Ga—Zn-based oxide material, an Al—Ga—Zn-based oxide material, or a Sn—Al—Zn-based oxide material; a two-component metal oxide such as an In—Zn-based oxide material, a Sn—Zn-based oxide material, an Al—Zn-based oxide material, a Zn—Mg-based oxide material, a Sn—Mg-based oxide, an In—Mg-based oxide, or an In—Ga-based oxide material.

Figure 9A:
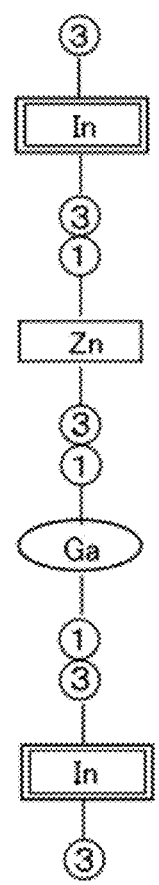
FIGS. 9A to 9C illustrate a structure of an oxide material according to one embodiment of the present invention.

As an example, FIG. 9A illustrates a model of one group included in a layered structure of an In—Ga—Zn—O-based material.

In the group included in the layered structure of the In—Ga—Zn—O-based material in FIG. 9A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A unit is formed by bonding a plurality of groups, which corresponds to one cycle.

Figure 9B:
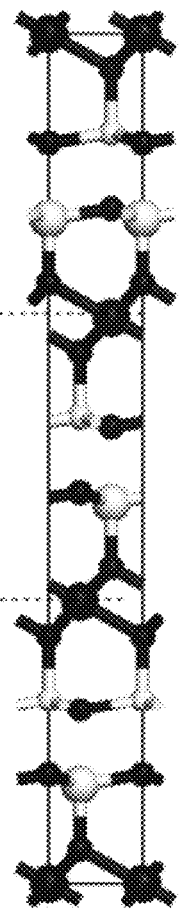
Figure 9C:
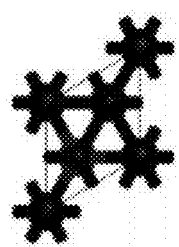

FIG. 9B illustrates a unit including three groups. Note that FIG. 9C illustrates an atomic arrangement in the case where the layered structure in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a subunit including any of an In atom, a Zn atom, or a Ga atom is 0. As a result, the total electric charge of a group having a combination of such subunits is always 0.

In order to form the layered structure of the In—Ga—Zn—O-based material, a unit can be formed using not only the group illustrated in FIG. 9A but also a combination of groups having different arrangement of the In atom, the Ga atom, and the Zn atom.

The interlayer insulating film 114 may be formed with a single layer or a stacked layer using one or more of silicon oxide, silicon oxynitride, silicon nitride oxide, silicon nitride, aluminum oxide, aluminum oxynitride, and aluminum nitride by a sputtering method, a CVD method, or the like. For example, the interlayer insulating film 114 may be formed by a plasma CVD method with use of a mixture which includes a silane gas as a main material and a proper source gas selected from a nitrogen oxide gas, a nitrogen gas, a hydrogen gas, and a rare gas. In addition, the substrate temperature is preferably higher than or equal to 200° C. and lower than or equal to 550° C.

In this embodiment, the gate electrode 106 does not overlap with the pair of low-resistance regions 102 or the pair of electrodes 110 and an offset region is formed. However, the present invention is not limited to the above structure. For example, a structure in which the gate electrode 106 overlaps with the pair of low-resistance regions 102 or the pair of electrodes 110 may be employed.

According to the structure described above, in the transistor 150a and the transistor 150b, the semiconductor substrate 100 functioning as a channel region of the transistor 150a and the semiconductor film 112 functioning as a channel region of the transistor 150b are formed to cover the gate electrode 106. Accordingly, the effective channel length can be longer than an apparent channel length that is a distance between the pair of low-resistance regions 102 or between the pair of electrodes 110 viewed from above. Further, transistors can be stacked, so that an area of a semiconductor device can be reduced. Therefore, the influence of the short-channel effect can be reduced even when the size of the transistor is reduced, and thus the integration degree of the semiconductor device can be increased. Further, the semiconductor device whose manufacturing cost is low can be provided with high yield.

Furthermore, in the transistor structure illustrated in FIG. 1B, the length L1 or L2 is adjusted, whereby the effective channel length of the transistor 150*a* or the transistor 150*b* can be controlled. For example, in the case where the on-state current of the transistor 150*b* is increased, the length L2 is made small, so that the on-state current of the transistor 150*b* can be increased.

As described above, by adjusting the length of L1 or L2, the on-state current of the transistor 150*a* or the transistor 150*b* can be controlled. In ideal operation of an inverter circuit, the rise time and the fall time of a rectangular wave input/output to/from the inverter are equal to each other. For example, in a CMOS inverter, in the case where there is a large difference between the on-state current of a p-channel transistor and the on-state current of an n-channel transistor, even if the input rectangular wave has an ideal form, the waveform is distorted when the signal is output. For example, in the case where the on-state current of the p-channel transistor is only half the on-state current of the n-channel transistor, the rise time at the output node is twice as long as the fall time. In order to prevent distortion of the waveform, it is preferable that the amount of on-state current of the p-channel transistor and the amount of on-state current of the n-channel transistor be equivalent to each other.

Figure 2B:
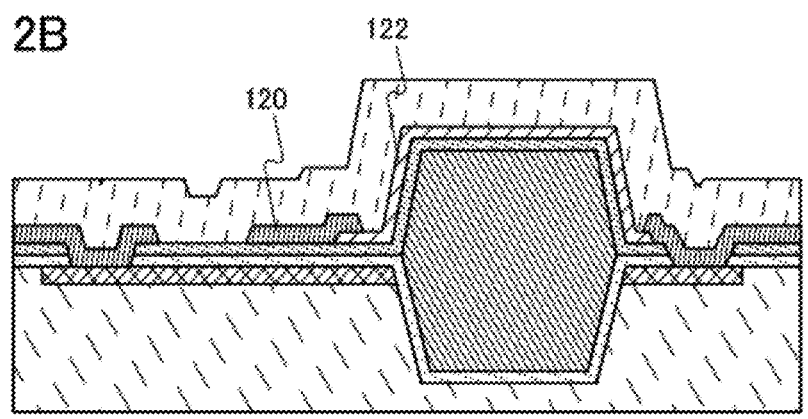

Transistors having structures illustrated in FIGS. 2A and 2B can obtain the effect similar to that of the transistors illustrated in FIGS. 1A and 1B. A difference between the structure of the transistors in FIG. 2A and the structure of the transistors in FIGS. 1A and 1B is a shape of the gate electrode in the transistor 150*b*. Whereas the gate electrode 106 illustrated in FIG. 1B is formed to completely fill the groove portion provided in the semiconductor substrate 100, a gate electrode 106*b* illustrated in FIG. 2A does not completely fill the groove portion provided in the semiconductor substrate 100. Thus, when the gate electrode is not formed to fill the groove portion completely but formed along a shape of the groove portion, the effect of the present invention can be obtained as well. A difference between the structure of the transistors in FIG. 2B and the structure of the transistors in FIGS. 1A and 1B is the stacked order of the pair of electrodes and the semiconductor film. That is, in the transistor structure illustrated in FIG. 2B, a pair of electrodes 120 is formed over a semiconductor film 122.

Figure 3A:
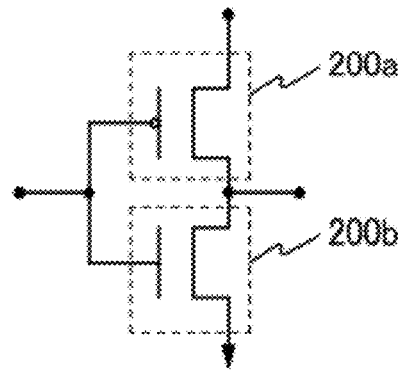
FIGS. 3A to 3C are circuit diagrams showing examples of a semiconductor device according to one embodiment of the present invention.

With use of any of the transistors illustrated in FIGS. 1A and 1B and FIGS. 2A and 2B, an inverter circuit shown in FIG. 3A can be formed. For formation of the inverter circuit, an n-channel transistor and a p-channel transistor are needed. For example, the transistor 150*a* and the transistor 150*b* in FIGS. 1A and 1B can be a p-channel transistor and an n-channel transistor, respectively.

In the inverter circuit illustrated in FIG. 3A, gate electrodes of an n-channel transistor 200*b* and a p-channel transistor 200*a* are connected to each other, and one of a source and a drain of the n-channel transistor 200*b* is connected to one of a source and a drain of the p-channel transistor 200*a*. The inverter circuit can be formed using any of the transistors illustrated in FIGS. 1A and 1B and FIGS. 2A and 2B. For example, as the p-channel transistor 200*a* and the n-channel transistor 200*b*, the transistor 150*a* and the transistor 150*b* illustrated in FIGS. 1A and 1B can be used respectively.

Figure 3B:
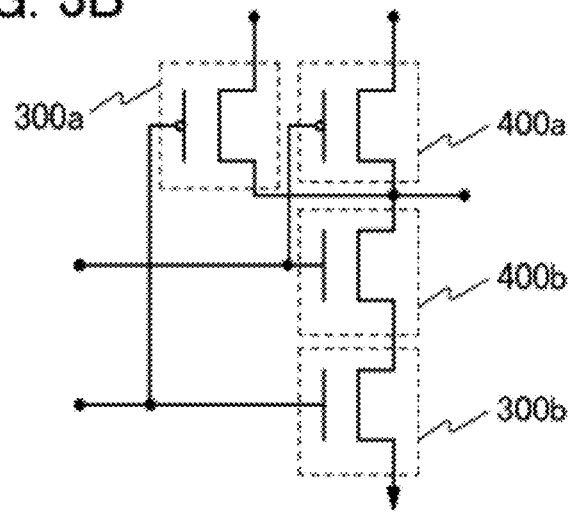
Figure 3C:
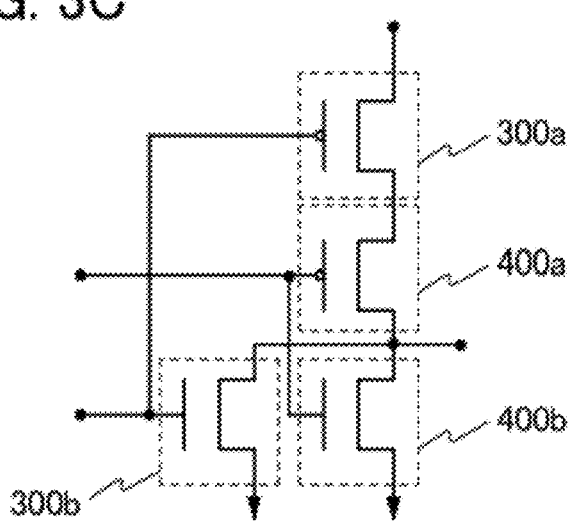

Further, by combining the inverter circuits illustrated in FIG. 3A, a NAND circuit illustrated in FIG. 3B and a NOR circuit illustrated in FIG. 3C can be formed. For example, by combining a p-channel transistor 300*a* and an n-channel transistor 300*b* whose gate electrodes are connected and a p-channel transistor 400*a* and an n-channel transistor 400*b* whose gate electrodes are connected, circuits as illustrated in FIGS. 3B and 3C can be formed. Furthermore, with use of a logic circuit as above, a semiconductor integrated circuit such as a CPU can be formed.

<Example of Method for Manufacturing Transistor>

Next, an example of a method for manufacturing the transistor illustrated in FIGS. 1A and 1B will be described with reference to FIGS. 4A to 4D.

Figure 4A:
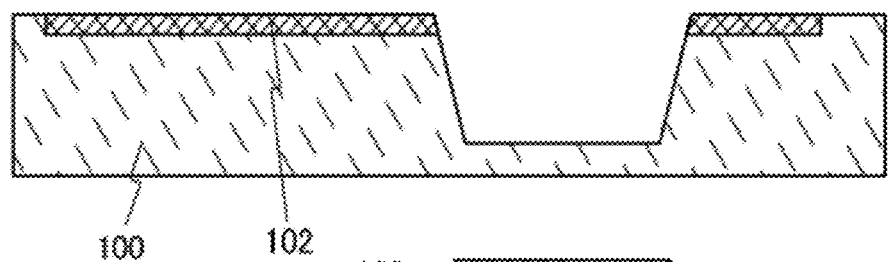
FIGS. 4A to 4D are cross-sectional views illustrating an example of a manufacturing process of a semiconductor device according to one embodiment of the present invention.

As illustrated in FIG. 4A, an impurity is added to a surface of the semiconductor substrate 100, whereby the pair of low-resistance regions 102 is formed, and the semiconductor substrate 100 is processed, so that the groove portion is provided. Although the groove portion illustrated in FIG. 4A has a depressed shape, the shape of the groove portion is not limited to this shape. A curved shape or the like may be employed.

Next, the first gate insulating film 104 is formed on the surface of the semiconductor substrate 100 by a thermal oxidation method. Instead of a thermal oxidation method, an insulating film may be formed by a deposition method such as a sputtering method or a CVD method. Alternatively, an insulating film may be formed with a combination of a thermal oxidation method and a deposition method.

Next, the gate electrode 106 is formed over the first gate insulating film 104. The gate electrode 106 is formed in such a manner that a conductive film is formed, a mask is formed over the conductive film, and the conductive film is selectively etched with use of the mask.

The mask can be formed as appropriate by a photolithography process, an inkjet method, a printing method, or the like. Wet etching or dry etching may be employed as appropriate for the etching.

The pair of low-resistance regions 102 illustrated in FIG. 4A can be formed also in such a manner that an impurity is added to the semiconductor substrate 100 with use of the gate electrode 106 as a mask after the gate electrode 106 is formed.

Figure 4B:
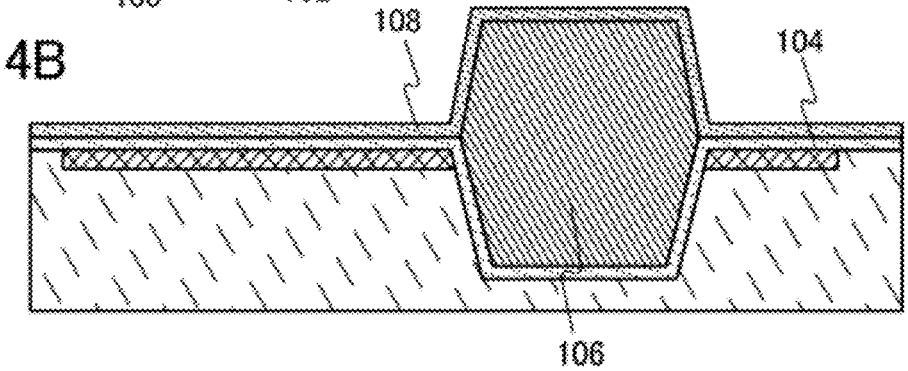

Next, the second gate insulating film 108 is formed over the gate electrode 106 and the first gate insulating film 104 (see FIG. 4B).

Figure 4C:
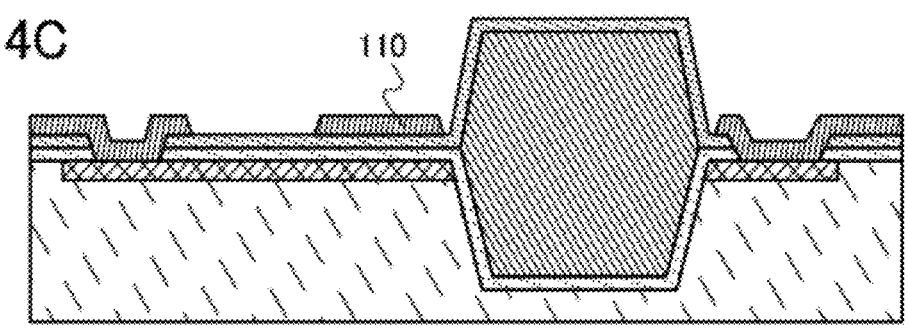

Next, as illustrated in FIG. 4C, the first gate insulating film 104 and the second gate insulating film 108 are processed to form contact holes, and the pair of electrodes 110 is formed so as to be connected to the pair of low-resistance regions 102 through the contact holes. The pair of electrodes 110 is formed in such a manner that a conductive film is formed, a mask is formed over the conductive film, and the conductive film is selectively etched with use of the mask.

Figure 4D:
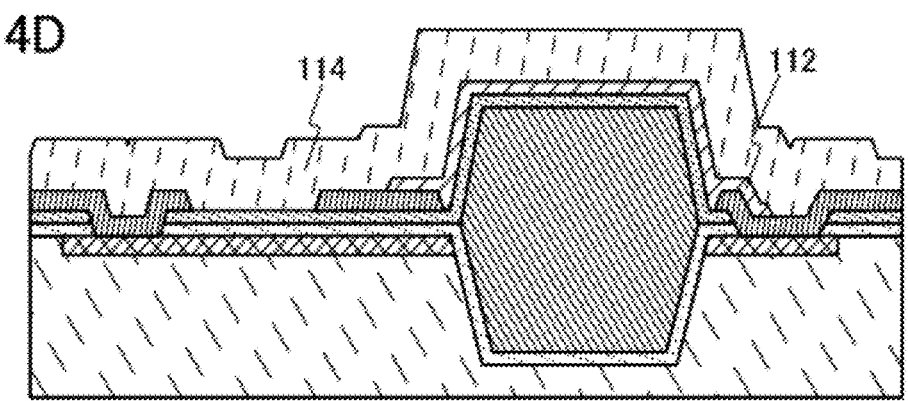

Next, as illustrated in FIG. 4D, the semiconductor film 112 is formed to be in contact with the pair of electrodes 110 and overlap with the gate electrode 106 with the second gate insulating film 108 interposed therebetween. The semiconductor film 112 is formed in such a manner, for example, that an oxide semiconductor film with a thickness of greater than or equal to 1 nm and less than or equal to 50 nm is formed by a sputtering method, a mask is formed over the oxide semiconductor film, and the oxide semiconductor film is selectively etched with use of the mask.

After the oxide semiconductor film is formed, the semiconductor substrate 100 is preferably subjected to heat treatment to release moisture and hydrogen from the oxide semiconductor film. Through the heat treatment, a CAAC-OS film with higher crystallinity can be formed.

The temperature for the heat treatment is preferably set such that moisture and hydrogen can be released from the oxide semiconductor film; the temperature is typically higher than or equal to 200° C. and lower than the strain point of the semiconductor substrate 100, preferably higher than or equal to 250° C. and lower than or equal to 450° C.

A rapid thermal annealing (RTA) apparatus can be used for the heat treatment. With use of the RTA apparatus, heat treatment can be performed at a temperature that is higher than or equal to the strain point of the substrate if it is a short time. Thus, the time required for formation of the CAAC-OS film can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere, a reduced-pressure atmosphere, or in vacuum. The treatment time is from 3 minutes to 24 hours. Heat treatment for longer than 24 hours is not preferable because the productivity is reduced.

In addition, after moisture and hydrogen are released from the oxide semiconductor film by the above heat treatment, the oxide semiconductor film may be heated in an oxygen atmosphere, so that oxygen is supplied to the oxide semiconductor film, and accordingly oxygen vacancies serving as a donor in the oxide semiconductor film may be reduced. The temperature of the heat treatment is higher than or equal to 200° C. and lower than the strain point of the semiconductor substrate 100, preferably, higher than or equal to 250° C. and lower than or equal to 450° C. It is preferable that an oxygen gas used for the heat treatment in an oxygen atmosphere do not include water, hydrogen, or the like. Alternatively, the purity of the oxygen gas which is introduced into the heat treatment apparatus is preferably greater than or equal to 6N (99.9999%) or further preferably greater than or equal to 7N (99.99999%) (that is, the impurity concentration in the oxygen is lower than or equal to 1 ppm, or preferably lower than or equal to 0.1 ppm).

Alternatively, oxygen may be added to the oxide semiconductor film by an ion implantation method or an ion doping method, so that oxygen vacancies serving as a donor is reduced. Further alternatively, oxygen which is made to be plasma may be added to the oxide semiconductor film with a microwave with a frequency of 2.45 GHz.

Next, the interlayer insulating film 114 is formed over the semiconductor film 112 (see FIG. 4D). Although not illustrated here, contact holes may be formed in the interlayer insulating film 114, and wirings connected to the pair of low-resistance regions 102 or the pair of electrodes 110 through the contact holes may be formed.

Through the above steps, a transistor which achieves miniaturization and suppression of a short-channel effect and consumes less power can be manufactured.

This embodiment can be combined with any of the other embodiment as appropriate.

Embodiment 2

In this embodiment, an example of forming a central processing unit (CPU) which includes the transistor described in Embodiment 1 will be described.

Figure 5A:
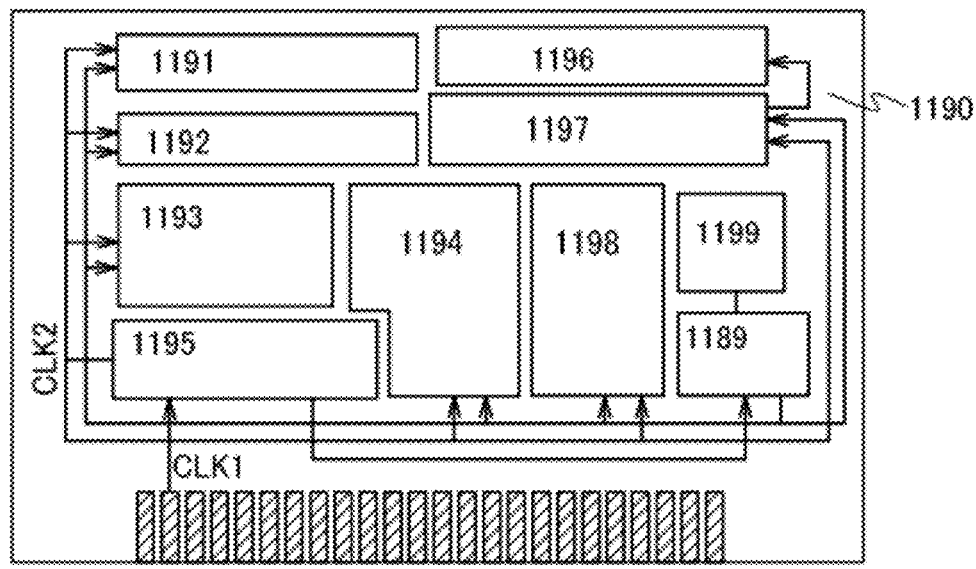
FIG. 5A is a block diagram showing a specific example of a CPU including a semiconductor device according to one embodiment of the present invention.

FIG. 5A is a block diagram illustrating a specific structure of a CPU. The CPU illustrated in FIG. 5A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a ROM 1199 which is rewritable, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 5A is just an example in which the configuration has been simplified, and various configurations can be applied to an actual CPU depending on the application.

An instruction that is input to the CPU via the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 5A, a memory element is provided in the register 1196. A memory element including the transistor described in Embodiment 1 can be used as the memory element provided in the register 1196.

In the CPU illustrated in FIG. 5A, the register controller 1197 selects operation of holding data in the register 1196 in accordance with an instruction from the ALU 1191. That is, the register controller 1197 selects whether data is held by a phase-inversion element or by a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 5B:
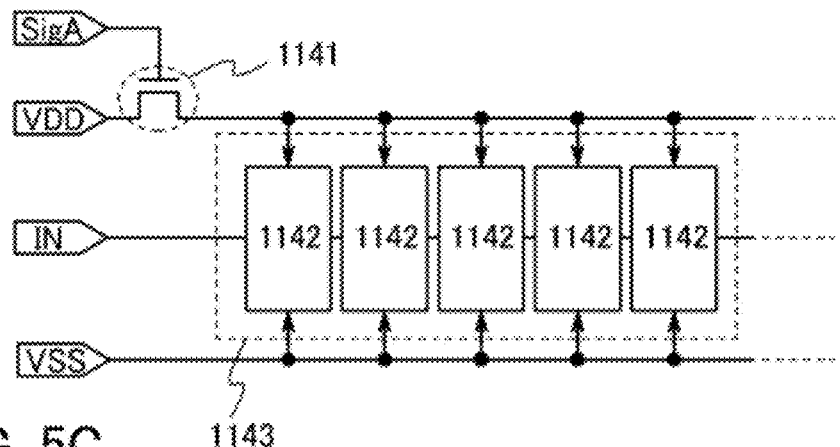
FIGS. 5B and 5C are circuit diagrams of part thereof.
Figure 5C:
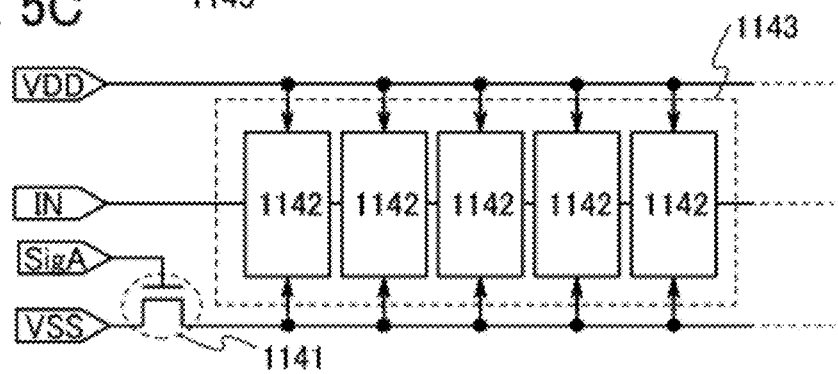

A switching element is provided between a memory element group and a node to which a power supply potential VDD or a power supply potential VSS is supplied, as illustrated in FIG. 5B or FIG. 5C, so that the power supply can be stopped. Circuits illustrated in FIGS. 5B and 5C are described below.

FIGS. 5B and 5C each illustrate an example of a structure of a memory circuit including a transistor including an oxide semiconductor as a switching element for controlling supply of a power supply potential to a memory element.

The memory device illustrated in FIG. 5B includes a switching element 1141 and a memory element group 1143 including a plurality of memory elements 1142. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 5B, a transistor including a semiconductor with a wide band gap such as an oxide semiconductor is used as the switching element 1141, and the switching of the transistor is controlled by a signal Sig A supplied to a gate thereof Note that FIG. 5B illustrates the structure in which the switching element 1141 includes only one transistor; however, without limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 5B, the switching element 1141 may control the supply of the low-level power supply potential VSS.

In FIG. 5C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

Data can be held even in the case where an operation of a CPU is temporarily stopped and the supply of the power supply voltage is stopped by providing a witching element between a memory element group and a node to which the power supply potential VDD or the power supply potential VSS is supplied; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be combined with any of the other embodiment as appropriate.

Embodiment 3

In this embodiment, examples of electronic devices to which Embodiments 1 and 2 are applied will be described.

Figure 6A:
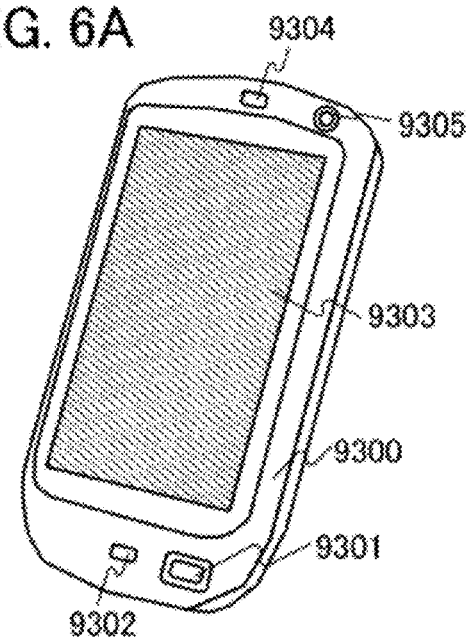
FIGS. 6A and 6B are perspective views each illustrating an example of an electronic device which is one embodiment of the present invention.

FIG. 6A illustrates a portable information terminal. The portable information terminal includes a housing 9300, a button 9301, a microphone 9302, a display portion 9303, a speaker 9304, and a camera 9305, and has a function as a mobile phone. Although not particularly illustrated, one embodiment of the present invention can be also applied to a logic circuit used for an arithmetic device, a wireless circuit, or a memory circuit in a main body.

Figure 6B:
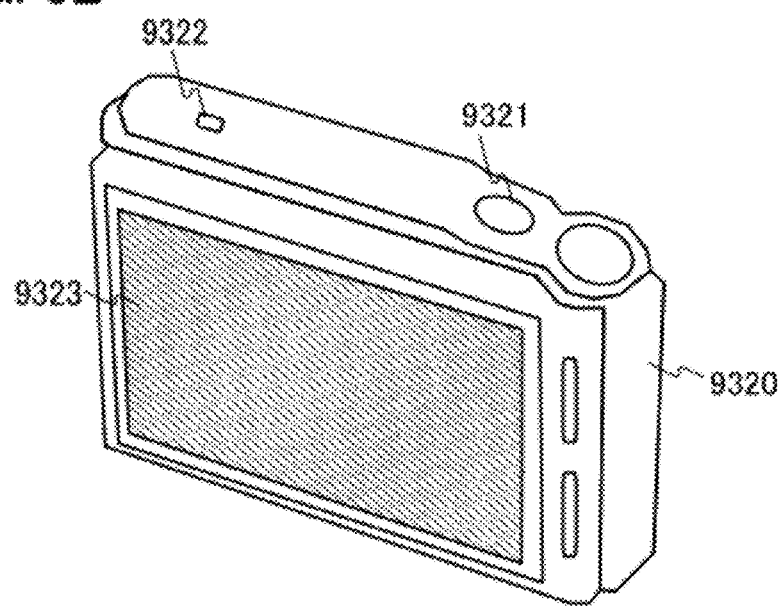

FIG. 6B illustrates a digital still camera. The digital still camera includes a housing 9320, a button 9321, a microphone 9322, and a display portion 9323. Although not particularly illustrated, one embodiment of the present invention can be also applied to a logic circuit used for an arithmetic device, a wireless circuit, or a memory circuit in a main body.

By applying one embodiment of the present invention, the performance of an electric device can be improved and the reliability of the electric device can be improved.

This embodiment can be implemented in appropriate combination with the other embodiments.

This application is based on Japanese Patent Application serial no. 2011-102553 filed with Japan Patent Office on Apr. 29, 2011, the entire contents of which are hereby incorporated by reference.

What is claimed is:

1. A semiconductor device comprising:
a first transistor and a second transistor overlapping with each other,
wherein the first transistor comprises:
a semiconductor substrate comprising a source region, a drain region and a groove portion between the source region and the drain region;
a first gate insulating film formed along a shape of the groove portion; and
a gate electrode formed in the groove portion with the first gate insulating film interposed therebetween,
wherein the second transistor comprises:
the gate electrode formed in the groove portion;
a second gate insulating film covering the gate electrode;
a semiconductor film overlapping with the gate electrode with the second gate insulating film interposed therebetween; and
a pair of electrodes formed in contact with the semiconductor film,
wherein each of the pair of electrodes is a metal layer, and
wherein one of the source region and the drain region is electrically connected to one of the pair of electrodes.

2. The semiconductor device according to claim 1, wherein the pair of electrodes is formed between the second gate insulating film and the semiconductor film.

3. The semiconductor device according to claim 1, wherein the semiconductor film is formed between the second gate insulating film and the pair of electrodes.

4. The semiconductor device according to claim 1, wherein the semiconductor substrate is an n-type semiconductor and the source region and the drain region are a p-type semiconductor.

5. The semiconductor device according to claim 1, wherein the semiconductor film comprises an oxide semiconductor comprising at least one of elements of In, Ga, Sn, and Zn.

6. A semiconductor device comprising:
a semiconductor substrate comprising a source region, a drain region and a groove portion between the source region and the drain region;
a first gate insulating film over the semiconductor substrate;
a gate electrode overlapping with the groove portion with the first gate insulating film interposed therebetween;
a second gate insulating film covering the gate electrode;
a pair of electrodes provided over the second gate insulating film so that the groove portion is sandwiched between the pair of electrodes; and
a semiconductor film which is in contact with the pair of electrodes and overlaps with the gate electrode with the second gate insulating film interposed therebetween,
wherein each of the pair of electrodes is a metal layer, and
wherein one of the source region and the drain region is electrically connected to one of the pair of electrodes.

7. The semiconductor device according to claim 6, wherein the pair of electrodes is formed between the second gate insulating film and the semiconductor film.

8. The semiconductor device according to claim 6, wherein the semiconductor film is formed between the second gate insulating film and the pair of electrodes.

9. The semiconductor device according to claim 6, wherein the semiconductor substrate is an n-type semiconductor and the source region and the drain region are a p-type semiconductor.

10. The semiconductor device according to claim 6, wherein the semiconductor film comprises an oxide semiconductor comprising at least one of elements of In, Ga, Sn, and Zn.

11. The semiconductor device according to claim 1, wherein the metal layer contains at least one of aluminum, titanium, chromium, nickel, copper, yttrium, zirconium, molybdenum, silver and tantalum.

12. The semiconductor device according to claim 6, wherein the metal layer contains at least one of aluminum, titanium, chromium, nickel, copper, yttrium, zirconium, molybdenum, silver and tantalum.

* * * * *